United States Patent
Sengoku et al.

(10) Patent No.: US 6,946,305 B2
(45) Date of Patent: Sep. 20, 2005

(54) APPARATUS FOR EVALUATING AMOUNT OF CHARGE, METHOD FOR FABRICATING THE SAME, AND METHOD FOR EVALUATING AMOUNT OF CHARGE

(75) Inventors: Naohisa Sengoku, Kanagawa (JP); Michikazu Matsumoto, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 103 days.

(21) Appl. No.: 10/684,465

(22) Filed: Oct. 15, 2003

(65) Prior Publication Data

US 2004/0110315 A1 Jun. 10, 2004

(30) Foreign Application Priority Data

Dec. 6, 2002 (JP) .................................. 2002-355560

(51) Int. Cl.⁷ ............................................. G01R 31/26
(52) U.S. Cl. ........................... 438/14; 438/17; 438/15; 438/18
(58) Field of Search ................... 438/14, 17, 18, 438/15, 10, 11, 452, 250, 393, 4, 9

(56) References Cited

U.S. PATENT DOCUMENTS

| | | | | |
|---|---|---|---|---|
| 4,048,350 A | * | 9/1977 | Glang et al. ............. | 438/766 |
| 5,508,542 A | * | 4/1996 | Geiss et al. ............. | 257/301 |
| 5,583,369 A | * | 12/1996 | Yamazaki et al. ........ | 257/635 |
| 5,635,419 A | * | 6/1997 | Geiss et al. ............. | 438/386 |
| 5,644,156 A | * | 7/1997 | Suzuki et al. ........... | 257/485 |
| 5,719,065 A | * | 2/1998 | Takemura et al. ........ | 438/163 |
| 5,817,533 A | * | 10/1998 | Sen et al. ............... | 438/4 |
| 5,851,842 A | * | 12/1998 | Katsumata et al. ....... | 438/9 |
| 5,904,490 A | * | 5/1999 | Tabara .................... | 438/18 |
| 6,528,390 B2 | * | 3/2003 | Komori et al. .......... | 438/452 |
| 6,855,569 B1 | * | 2/2005 | Sarfaty ................... | 438/17 |
| 6,884,638 B1 | * | 4/2005 | Yang et al. .............. | 438/14 |

FOREIGN PATENT DOCUMENTS

| JP | 5-90374 | 4/1993 |
|---|---|---|
| JP | 10-270519 | 10/1998 |

* cited by examiner

Primary Examiner—Laura M. Schillinger
(74) Attorney, Agent, or Firm—McDermott Will & Emery LLP

(57) ABSTRACT

A wafer for charge amount evaluation having a silicon substrate and p-type regions sandwiched between a first silicon oxide film and a SA-NSG film and surrounded by an undoped silicon film is prepared and subjected to a target process for which an amount of charge is to be evaluated. Then, etching is performed by using a BHF solution. By measuring an amount of etching in the p-type region, an amount of positive charge caused by the process in the wafer can be evaluated quantitatively in an easy and convenient manner.

6 Claims, 10 Drawing Sheets

Microscopic

SEM

Microscopic

SEM

APPARATUS FOR EVALUATING AMOUNT OF CHARGE, METHOD FOR FABRICATING THE SAME, AND METHOD FOR EVALUATING AMOUNT OF CHARGE

BACKGROUND OF THE INVENTION

The present invention relates to an apparatus for evaluating an amount of charge on a semiconductor device and to a method for evaluating an amount of charge on a semiconductor device by using the apparatus.

In the process of fabricating a semiconductor device, charging of the semiconductor device leads to the degradation of reliability and performance thereof. To prevent this, a method for accurately measuring the charging of a semiconductor substrate or a semiconductor device, which occurs in the fabrication process therefor, is necessary.

However, no prior art technology has heretofore provided a method which allows direct measurement of an amount of charge on a semiconductor device and only a method which estimates an amount of charge supposed to have been accumulated in a semiconductor device during the fabrication process therefor is existing. The following is two examples of such an indirect method of estimating an amount of charge.

The first example is a method disclosed in Japanese Laid-Open Patent Publication No. HEI 10-270519 using a MOS capacitor. In accordance with the method, a MOS capacitor having a structure in which a gate insulating film is sandwiched between a semiconductor substrate and an upper electrode is produced and subjected to a target process for which an amount of charge is to be evaluated. Then, a leakage current between the gate (upper electrode) and substrate of the MOS capacitor is measured and an amount of charge accumulated in the semiconductor device is estimated from the result of the measurement. The method uses the experimental fact that a gate leakage current varies depending on a total amount of charge that has flown through the gate as stress. When the charge is accumulated in the MOS capacitor by the specified process, the charge escapes toward the substrate. Since the charge that has passed through the gate insulating film upon the escape toward the substrate forms fixed charge or an interface state in the insulating film, the characteristics of the gate insulating film change so that the leakage current between the gate and the substrate also changes.

The second example is a method disclosed in Japanese Laid-Open Patent Publication No. MEI 05-90374. In accordance with the method, a transistor is produced and subjected to a target process for which an amount of charge is to be evaluated. Then, the current-voltage characteristic of the transistor is measured and an amount of charge accumulated in the semiconductor device is estimated from the difference between current values before and after the process. The method also positively uses the experimental fact that the charge forms fixed charge and an interface state upon passing through the gate insulating film, similarly to the first method, to examine a change in the quality of the gate insulating film based on a drain saturation current Idsat during the operation of the transistor and thereby indirectly examine an amount of charge.

In accordance with each of the foregoing charge-amount estimating methods, the charge produced in the process of fabricating a semiconductor device is evaluated indirectly as the degradation of the gate oxide film so that it is difficult to accurately measure an amount of charge sufficiently quantitatively.

In addition, each of the methods requires an extra step of fabricating the device or the like so that it is difficult to evaluate an amount of charge easily and conveniently. Moreover, the conventional methods are also disadvantageous in that they cannot directly measure the present amount of charge on the semiconductor device.

SUMMARY OF THE INVENTION

It is therefore an object of the present invention to provide an apparatus and method for evaluating an amount of charge which allows easy and convenient quantitative evaluation of an amount of charge on a semiconductor device.

A first apparatus for evaluating an amount of charge according to the present invention comprises: a substrate having a substantially intrinsic undoped silicon layer; p-type regions dotted as discrete islands in the undoped silicon layer; and a first insulating layer provided over the undoped silicon layer and the p-type regions.

In the arrangement, positive charge produced during a process such as ion implantation or etching performed with respect to the apparatus for evaluating an amount of charge is accumulated in the p-type regions from a potential viewpoint. By performing wet etching, an amount of charge produced by a specified process on the apparatus for evaluating an amount of charge can be calculated based on the principle of anodization. In particular, the positive charge is retained till the measurement of the amount of charge so that the amount of charge is evaluated quantitatively.

A second insulating layer is provided in a region of the substrate located below the undoped silicon layer. Since the positive charge accumulated in the p-type regions is less likely to leak downwardly in the arrangement, more precise evaluation of the amount of charge can be performed.

Preferably, the second insulating layer has a thickness not less than 1 nm and not more than 500 nm. In particular, the thickness of the second insulating layer which is not less than 1 nm has made the positive charge retained in the p-type regions less likely to leak downward by tunneling.

Preferably, the undoped silicon layer has a thickness not less than 10 nm and not more than 10 $\mu$m.

Preferably, a concentration of an impurity contained in the p-type regions is not less than $1\times10^{16}$ cm$^{-3}$ and not more than $1\times10^{23}$ cm$^{-3}$. Since the concentration of the impurity contained in the p-type regions is not less than $1\times10^{16}$ cm$^{-3}$, wet etching of the p-type regions is performed effectively.

Preferably, a concentration of an impurity contained in the undoped silicon layer is not more than $1\times10^{15}$ cm$^{-3}$.

The first insulating film has a thickness not less than 1 nm and not more than 500 nm. The arrangement prevents the charge accumulated in the p-type regions from leaking toward the upper surface and allows induction and accumulation of positive charge in the p-type regions after the target process for which an amount of charge is to be evaluated.

A third insulating layer composed of an insulating material is further provided on a back surface of the semiconductor substrate. The arrangement allows even evaluation of an amount of charge using the back-surface scrubbing process.

Preferably, the third insulating layer has a thickness not less than 1 nm and not more than 500 nm.

The apparatus further comprises: a conductor film on the first insulating layer. By dry etching the conductor film, it becomes possible to estimate damage caused by a plasma during the dry etching of a gate electrode.

A second apparatus for evaluating an amount of charge according to the present invention comprises: a substrate having a silicon layer; p-type regions each surrounded by the silicon layer, having a valence band edge potential higher than that of the silicon layer, and composed of silicon containing a p-type impurity; and a first insulating layer provided over the silicon layer and the p-type regions.

If an amount of charge resulting from a certain process is to be evaluated, the arrangement allows confinement and accumulation of positive charge produced by the process in the p-type regions. If etching is performed by using a hydrofluoric acid or the like with the positive charge confined and accumulated in the p-type regions, the amount of charge resulting from the process can be calculated quantitatively from an amount of etching in each of the p-type regions in an easy and convenient manner.

A region of the substrate located under the silicon layer is provided with a second insulating layer. In the arrangement, positive charge accumulated in the p-type regions is less likely to leak downward so that an amount of charge is evaluated more precisely.

A third apparatus for evaluating an amount of charge according to the present invention comprises: a substrate having a first insulating layer; p-type regions dotted as discrete islands in the insulating layer and composed of silicon containing a p-type impurity; and a second insulating layer provided over the first insulating layer and the p-type regions. In the arrangement, the charge accumulated in the p-type regions is less likely to leak not only downwardly but also laterally so that an amount of charge is evaluated more precisely.

A method for fabricating an apparatus for evaluating an amount of charge according to the present invention comprises the steps of: forming a first insulating layer on a substrate; forming a substantially intrinsic undoped silicon layer on the first insulating layer; selectively introducing a p-type impurity into the undoped silicon layer and forming p-type regions dotted as discrete islands in the undoped silicon layer; and forming a second insulating layer over the undoped silicon layer and the p-type regions.

The method allows the fabrication of the apparatus for evaluating an amount of charge.

A method for evaluating an amount of charge according to the present invention comprises the steps of (a) preparing an apparatus for evaluating an amount of charge, the apparatus comprising a semiconductor substrate having a first insulating film on an upper portion thereof, a substantially intrinsic undoped silicon layer provided on the first insulating film, p-type regions each surrounded by the undoped silicon layer and composed of silicon containing a p-type impurity, and a second insulating film provided over the undoped silicon layer and the p-type regions; (b) performing a specified process with respect to the apparatus for evaluating an amount of charge; (c) after the step (b), immersing the apparatus for evaluating an amount of charge in an etching solution and etching at least the p-type regions in accordance with a principle of anodization; and (d) calculating, from an amount of etching in each of the p-type regions, an amount of charge caused by the specified process in the apparatus for evaluating an amount of charge.

In accordance with the method, the charge resulting from the specified process by the time of the step (c) is retained in the p-type regions so that the amount of charge is quantitatively calculated from an amount of etching in each of the p-type regions in an easy and convenient manner. This allows a process involving a small amount of charge to be developed by using the method.

The etching solution used in the step (c) contains ions including those of F atoms. The arrangement allows efficient etching to be performed in the step (c).

The step (d) includes calculating the amount of etching in each of the p-type regions from a change in a weight of the p-type region. If the thickness of the second insulating film is uniform within each of wafers, an amount of etching can be measured precisely.

The apparatus for evaluating an amount of charge further comprises a back-surface insulating film provided on a back surface of the semiconductor substrate and the specified process in the step (b) is a back-surface scrubbing process for cleaning the back-surface insulating film.

The specified process in the step (b) may be ion implantation.

The apparatus for evaluating an amount of charge further comprises a conductor film provided on the second insulating film and the specified process in the step (b) may be dry etching of the conductor film. In this case, the amount of charge calculated in the step (d) serves as the index of damage caused in a gate insulating film or the like by a plasma during the patterning of a gate electrode.

DETAILED DESCRIPTION OF THE INVENTION

As state previously, each of the conventional methods for evaluating an amount of charge has not directly measured charge caused by a specified process but has indirectly measured the influence of the fixed charge and interface state level formed by the charge. Therefore, it has been difficult to quantitatively measure an amount of charge in accordance with the conventional method. To eliminate the difficulty, the present inventors have attempted to find a method for measuring charge produced on a semiconductor device in a maximally direct manner.

The present inventors have considered that, to directly measure the charge produced on the semiconductor device, it is important to retain the charge caused by a process and accurately detect the retained charge. As a result of making various examinations, the present inventors have conceived the use of anodization as a method for detecting charge.

The anodization is a phenomenon in which p-type silicon immersed as an anode in a solution containing ions including those of F (fluorine) atoms is etched, which is used normally for the formation of porous silicon and the polishing of silicon. The present inventors have provided a wafer for evaluation with p-type silicon regions and treated the wafer for evaluation after the process with a HF solution or a BHF (buffered fluoric acid) solution, thereby enabling the detection of the generation of positive charge from a state in which the p-type silicon regions are etched. In accordance with the method, charge accumulated in the p-type silicon regions can be measured directly. Next, the present inventors have conceived the enclosure of the p-type silicon regions with a silicon oxide film and an undoped silicon film which do not allow easy passage of a current therethrough. This achieves confinement of positive charge in the p-type silicon regions because the valence band edge energy of each of the silicon dioxide film and the undoped silicon film is lower than that of the p-type silicon region. It is to be noted that "undoped" used herein indicates intentional non-introduction of an impurity.

The method described above allows direct and accurate measurement of charge produced in the step of processing the semiconductor device. A description will be given herein below to an embodiment using the method.

Embodiments

FIGS. 1A to 1D are cross-sectional views illustrating a method for fabricating a wafer for charge amount evaluation (an apparatus for evaluating an amount of charge) according to the present invention.

Figure 1A:
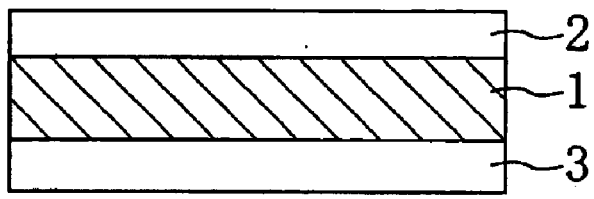
FIGS. 1A to 1D are cross-sectional views illustrating a method for fabricating a wafer for charge amount evaluation according to an embodiment of the present invention.

In the step shown in FIG. 1A, a semiconductor substrate such as a silicon substrate 1 in the form of a wafer is prepared. Then, a first silicon oxide film 2 with a thickness of 100 nm is formed on the top surface of the silicon substrate 1, while a second silicon oxide film 3 with a thickness of 100 nm is formed on the back surface thereof, each by thermal oxidation or the like. Preferably, the thickness of the first silicon oxide film 2 is not less than 1 nm and not more than 500 nm. This is because, if the thickness of the first silicon oxide film 2 is less than 1 nm, charge to be accumulated in p-type regions 6, which will be described later, may leak toward the substrate by tunneling. On the other hand, the first silicon oxide film 2 thicker than necessary leads to higher fabrication cost in actually producing the apparatus and has no advantage so that the thickness of the first silicon oxide film 2 is preferably not more than 500 nm. The thickness of the second silicon oxide film 3 is preferably not less than 1 nm and not more than 500 nm because the second silicon oxide film 3 of such a thickness can be formed simultaneously with the formation of the first silicon oxide film 2.

Figure 1B:
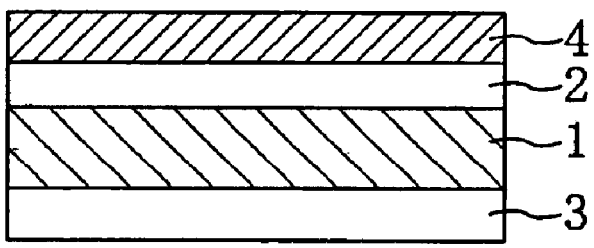

Subsequently, in the step shown in FIG. 1B, an undoped silicon film 4 with a thickness of 100 nm is formed on the first silicon oxide film 2 by LP-CVD. It is realistic and preferable to limit the thickness of the first silicon oxide film 2 to a range not less than 10 nm and not more than 10 μm in terms of cost and the like. The material of the undoped silicon film 4 is preferably polysilicon or amorphous silicon in actual design. It is also possible to subsequently remove undoped silicon deposited resultantly in a small amount on the back surface of the second silicon oxide film 3. Instead of the substrate formed heretofore in the present and previous steps, a SOI substrate having the first silicon oxide film 2 and the undoped silicon film 4 may also be used.

Figure 1C:
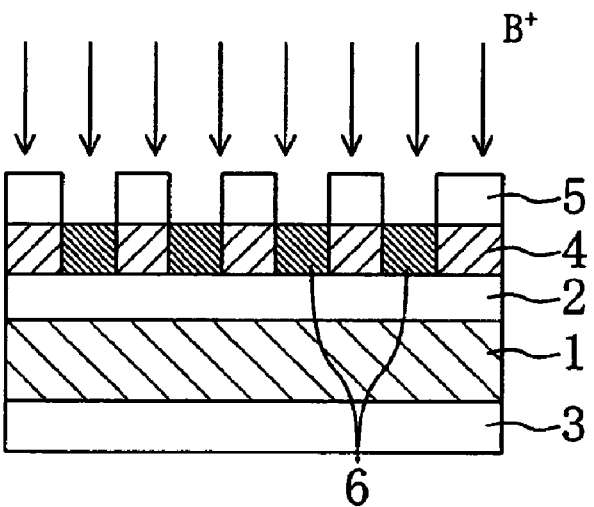

Next, in the step shown in FIG. 1C, a resist 5 is formed on the undoped silicon film 4 and patterned by a lithographic process or the like. Subsequently, ions of a p-type impurity, e.g., B (boron) ions are implanted at an implant energy of 10 eV and a dose of $1 \times 10^{15}$ cm$^{-2}$. Of the undoped silicon film 4, the portions into which the ions have been implanted by the present step form island (spotted) p-type regions 6. That is, the p-type regions 6 are provided in a discrete and dispersed configuration in the undoped silicon film 4. The range of the concentration of the impurity contained in the p-type regions 6 is not less than $1 \times 10^{16}$ cm$^{-3}$ and not more than $1 \times 10^{23}$ cm$^{-3}$. The undoped silicon film 4 surrounding the p-type regions 6 is substantially intrinsic. If the thickness of the undoped silicon film 4 is relatively large, the p-type regions 6 need not necessarily be in contact with the first silicon dioxide film 2. It is sufficient for the p-type regions 6 to be exposed at least on the upper portion of the undoped silicon film 4.

Figure 1D:
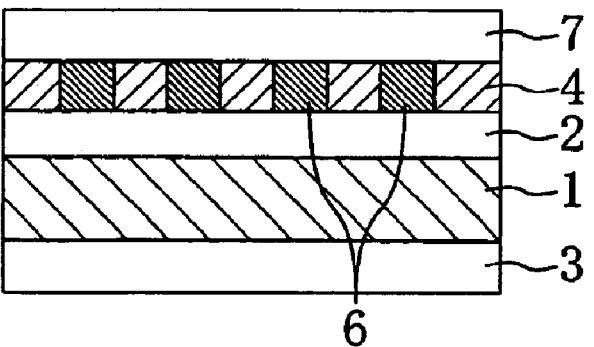

Next, in the step shown in FIG. 1D, the resist 5 is removed by cleaning and a SA-NSG film 7 with a thickness of 100 nm is formed as an insulator film over the undoped silicon film 4 and the p-type regions 6. The SA-NSG film used herein is a silicon oxide film not containing an impurity formed by CVD under a condition closer to a normal pressure. Instead of forming the SA-NSG film 7, the present step may also form a thermal oxide film by thermally oxidizing the undoped silicon film 4 and the p-type regions 6. Instead of the SA-NSG film 7, a silicon nitride film may also be formed.

Subsequently, the silicon substrate is annealed at 750° C. for 30 minutes so that the dopant is activated. For the annealing, a temperature of 500° C. or more is satisfactory. By the thermal treatment, the charge produced in the wafer for charge amount evaluation by the ion implantation for forming the p-type regions 6 is eliminated. By the foregoing steps, the wafer for charge amount evaluation is produced.

Specifically, the wafer for charge amount evaluation according to the present embodiment comprises: the silicon substrate 1; the first silicon oxide film 2 provided on the top surface of the silicon substrate 1; the undoped silicon film 4 provided on the first silicon oxide film 2; the p-type regions 6 provided in the undoped silicon film 4 and containing the p-type impurity; the SA-NSG film 7 provided over the undoped silicon film 4 and the p-type regions 6; and the second silicon oxide film 3 provided on the back surface of the silicon substrate 1.

If the wafer for charge amount evaluation according to the present embodiment is provided with a silicon oxide film instead of the undoped silicon layer 4, it can be used for the evaluation of an amount of charge.

Figure 2:
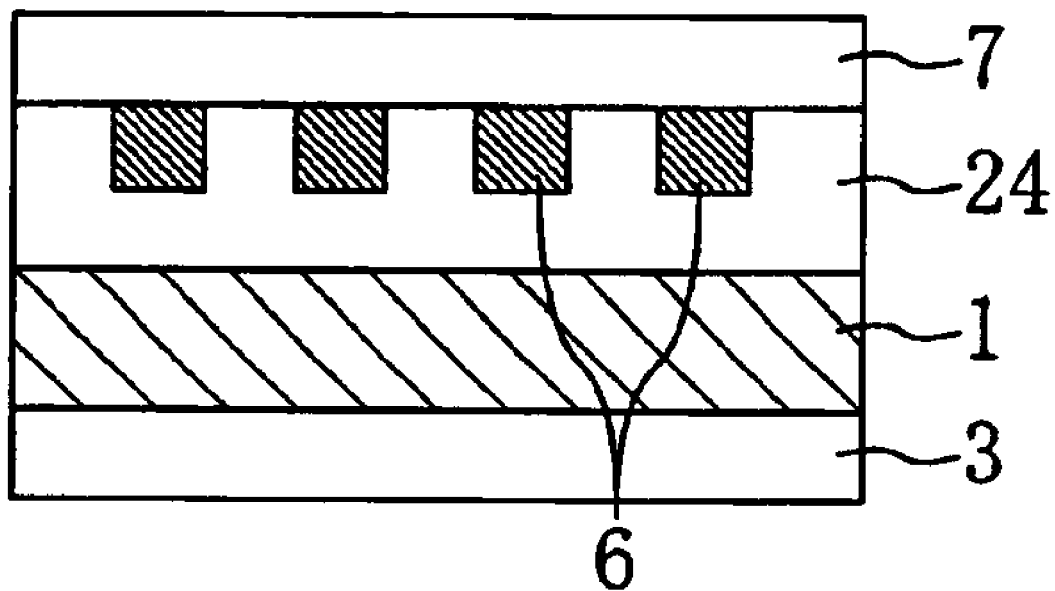
FIG. 2 is a cross-sectional view showing the wafer for charge amount evaluation when p-type regions 6 are formed in a trenched portion of an insulating film.

FIG. 2 is a cross-sectional view showing a wafer for charge amount evaluation in which the p-type regions 6 are formed in the trenched portions of an insulating film. Such a wafer for charge amount evaluation is produced as follows.

First, an insulating layer 24 composed of a silicon oxide is formed on the silicon substrate 1. Then, trenches are formed in the insulating layer 24, followed by an undoped silicon film over the substrate. Subsequently, the undoped silicon film is polished by CMN, thereby forming an undoped silicon layer for filling the trenches. Thereafter, p-type impurity ions are implanted in the undoped silicon layer to form the p-type regions 6 in the same manner as in the foregoing production method. Then, the SA-NSG film 7 is formed over the substrate, whereby the wafer for charge amount evaluation is produced.

Method for Evaluating Amount of Charge on Semiconductor Device

A method for evaluating an amount of charge by using the foregoing wafer for charge amount evaluation will be described herein below.

Figure 3A:
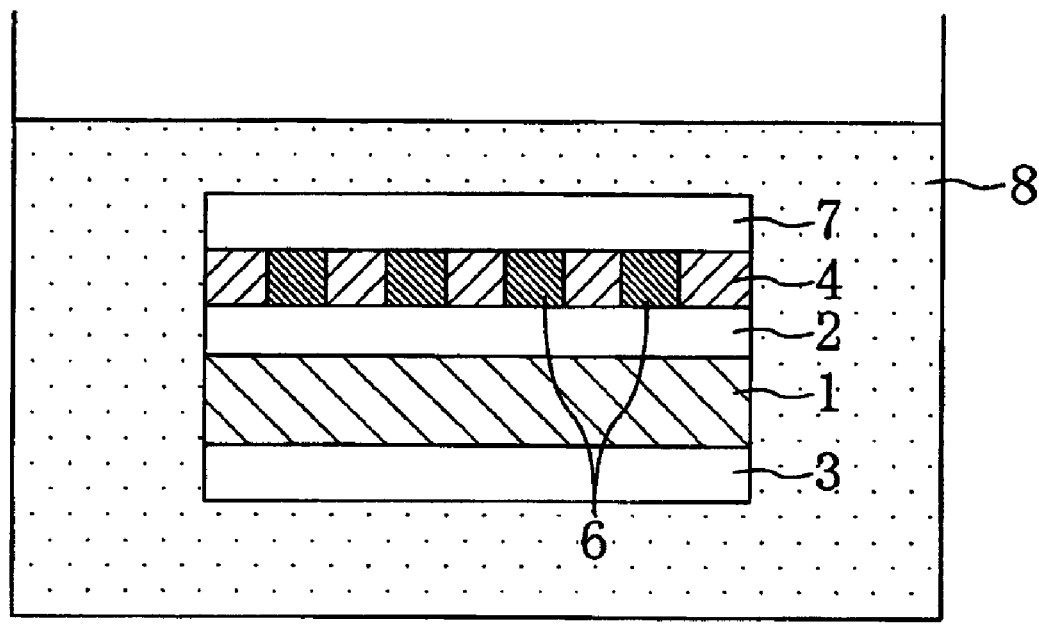
FIGS. 3A and 3B are cross-sectional views for illustrating a method for evaluating an amount of charge according to the embodiment of the present invention.
Figure 3B:
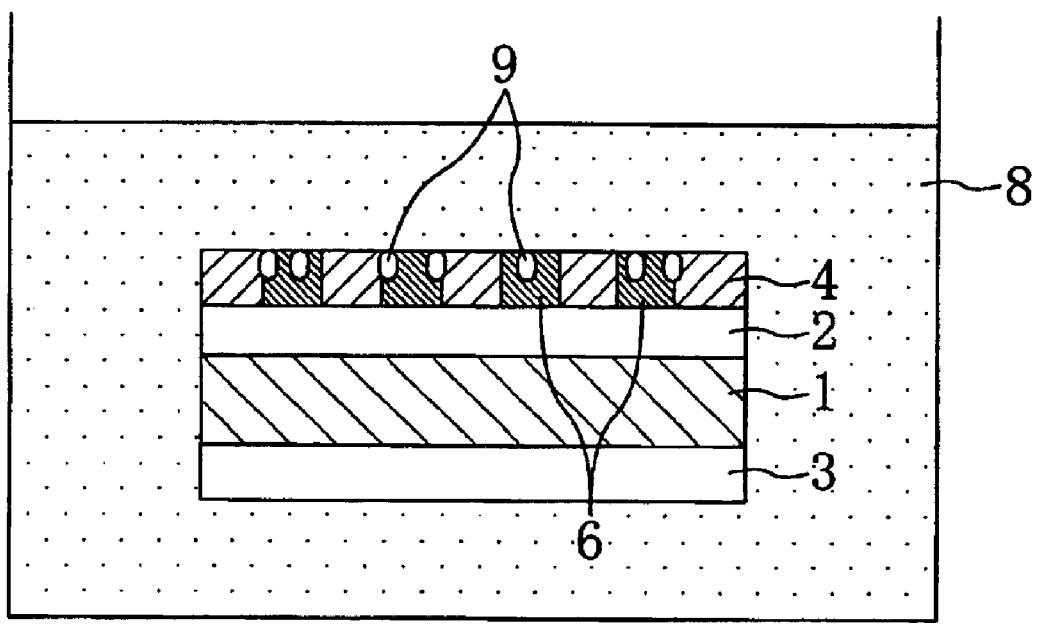

FIGS. 3A and 3B are cross-sectional views for illustrating the method for evaluating an amount of charge according to the present embodiment. First, the wafer for charge amount evaluation is processed by using a target fabrication apparatus for which an amount of charge is to be evaluated. As an example of the fabrication apparatus, an ion implanter, an apparatus for plasma etching, or the like can be listed.

Subsequently, as shown in FIG. 3A, the wafer for charge amount evaluation according to the present embodiment is immersed in a BHF solution 8 containing a surface active agent at a concentration ratio of 20:1 so that the uppermost-layer insulating film (SA-NSG film 7) is etched. Instead of the BHF solution, a solution containing ions including those of F (fluorine) atoms such as a DHF solution containing HF at a high concentration can be used as an etching solution. The concentration of the ions contained in the etching solution, including those of the F atoms, is in the range of approximately 0.1 to 50 wt. %. However, since the amount of the etched p-type silicon is directly proportional to $HF_2^-$ ions, the present method prefers the use of a BHF solution or a DHF solution containing HF at a high concentration to the use of a simple HF solution. In the present step, the second silicon oxide film 3 is also etched.

Next, as shown in FIG. 3B, the wafer for charge amount evaluation is immersed continuously in the BHF solution 8. At the instant at which the p-type regions 6 are exposed, they are etched to have a porous structure or electro polished.

On the other hand, the undoped silicon film 4 is not etched. The reason why the p-type regions 6 are etched selectively in the solution containing an hydrofluoric acid in the present step is that positive charge produced by the processing of the wafer for charge amount evaluation is retained in the p-type regions 6 in accordance with the principle of anodization described above. The reaction between the p-type silicon retaining the positive charge and $HF_2^-$ will be described below in greater detail with reference to the drawings.

Figure 4:
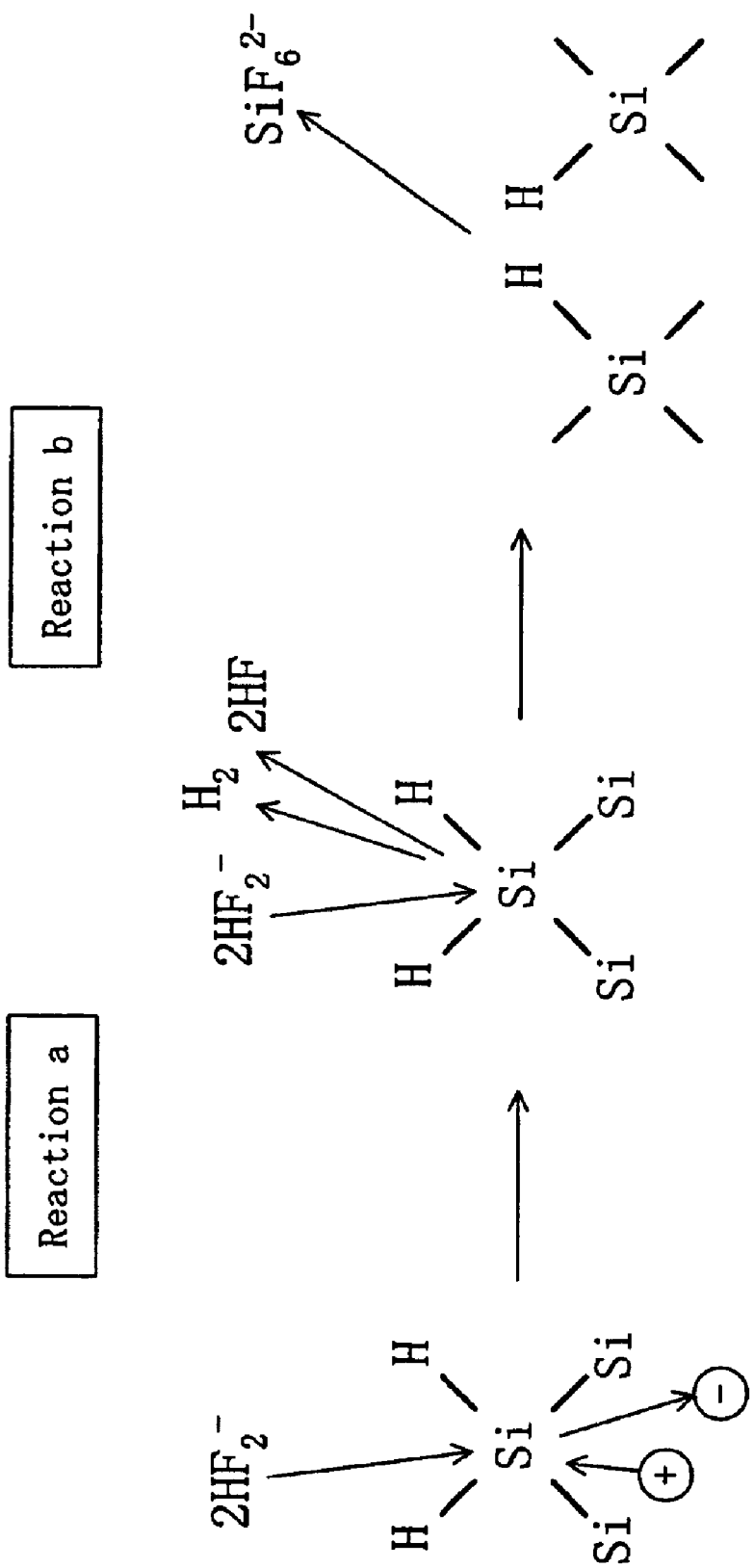
FIG. 4 is a view for illustrating the mechanism of a reaction between a hydrofluoric acid and p-type silicon.

FIG. 4 is a view for illustrating the mechanism of the reaction between the hydrofluoric acid and the p-type silicon.

With the positive charge accumulated in the p-type silicon, the density of electrons around silicon atoms therein. As a result, the silicon atom terminated by hydrogens is more susceptible to the attack of the $HF_2^-$ ion and each of the hydrogens bonded to silicon is substituted by F, while electrons are implanted into the substrate (reaction a). Then, if $HF_2^-$ acts on the silicon atom terminated by fluorines, the silicon atom becomes $SiF_6^{-2}$, which is liberated (reaction b). In this manner, the etching proceeds. By contrast, the positive charge is less likely to be accumulated in the undoped silicon so that the reaction (a) does not proceed and the etching hardly proceeds. Even if the wafer is not charged, however, the etching of polysilicon slightly occurs. This may be because the respective inherent energy levels of BHF and p-type polysilicon are different and the movement of charge occurs upon contact therebetween.

After performing the etching using the BHF solution as described above, the present embodiment determines the amount of charge accumulated in the p-type regions 6 from the amount of etching in the p-type regions 6.

Figure 5A:
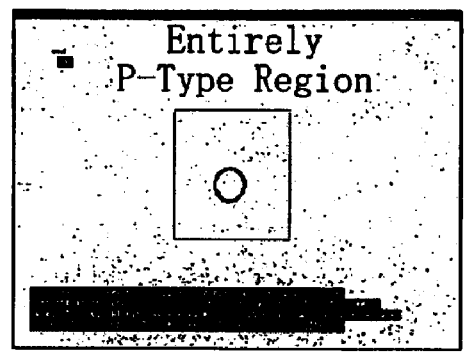
FIGS. 5A to 5D are microscopic photographs and SEM surface photographs of an etched p-type region.
Figure 5B:
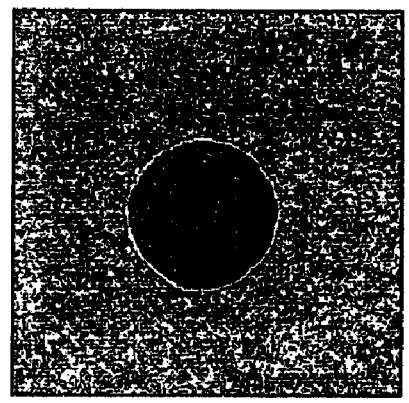
Figure 5C:
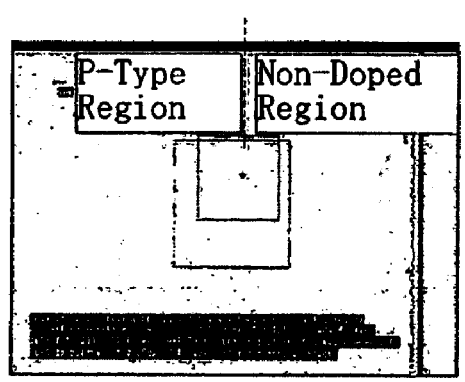
Figure 5D:
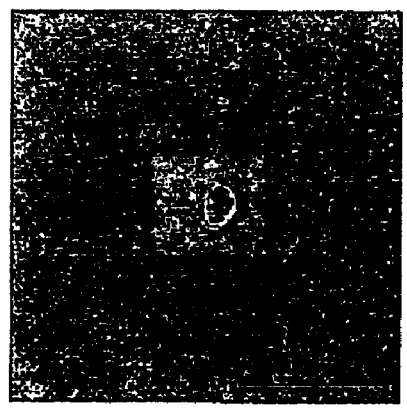

FIGS. 5A to 5D are microscopic photographs and SEM surface photographs of the etched p-type region 6, of which FIG. 5A is the microscopic photograph of an etched portion formed in the p-type region 6, FIG. 5B is the SEM photograph thereof, FIG. 5C is the microscopic photograph of an etched portion formed in the boundary area of the p-type region 6 with the undoped silicon region (shown as "Non-Doped Region" in FIG. 5C), and FIG. 5D is the SEM photograph thereof. The etched portion in the drawings corresponds to the etched silicon atom 9 shown in FIG. 3.

The number of silicon atoms determined from the sizes and number of the etched portions in the p-type region 6 shown in FIGS. 5A to 5D is substantially directly proportional to the amount of charge accumulated in the p-type region 6. Accordingly, the amount of charge accumulated in the p-type region 6 can be determined by measuring the sizes and number of the etched portions in each of wafers with and without a charging treatment with the use of a defect evaluating apparatus and calculating the difference between the quantities of etched silicon atoms. From the result, an amount of charge produced in the substrate by the process of fabricating a semiconductor device can be determined. The amount of etching in the p-type region 6 can also be determined by measuring changes in the mass of the wafer for charge amount evaluation instead of performing the measurement using the defect evaluating apparatus. In this case, precise measurement can be performed by accurately adjusting the respective thicknesses of the SA-NSG films 7 to uniform values for equal etching conditions.

In the method for evaluating an amount of charge according to the present embodiment, the charge produced during the processing of the semiconductor device is retained in the p-type regions 6. This allows direct measurement of an amount of charge on the semiconductor device with a higher accuracy than in the conventional embodiment. The direct measurement of an amount of charge also allows quantitative measurement.

In contrast to the conventional method which has required actual fabrication of a device, the method according to the present embodiment allows measurement of an amount of charge by merely performing wet etching after the processing of the wafer for charge amount evaluation so that it has been improved in easiness and convenience. This reduces a time required to evaluate an amount of charge on the semiconductor device as well as cost.

Accumulation of Charge in P-type Region

The following is a complementary description of the reason why holes are accumulated in the p-type regions 6 in accordance with the foregoing method for evaluating an amount of charge.

Figure 6A:
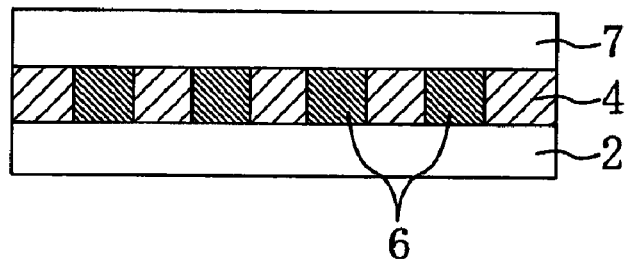
FIG. 6A is a view showing a cross section of an upper portion of a wafer for charge amount evaluation and FIGS. 6B and 6C are energy band diagrams in the cross section shown in FIG. 6A.
Figure 6B:
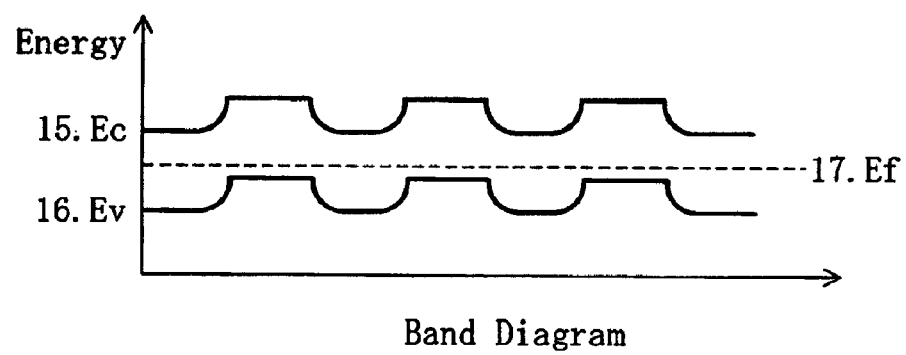
Figure 6C:
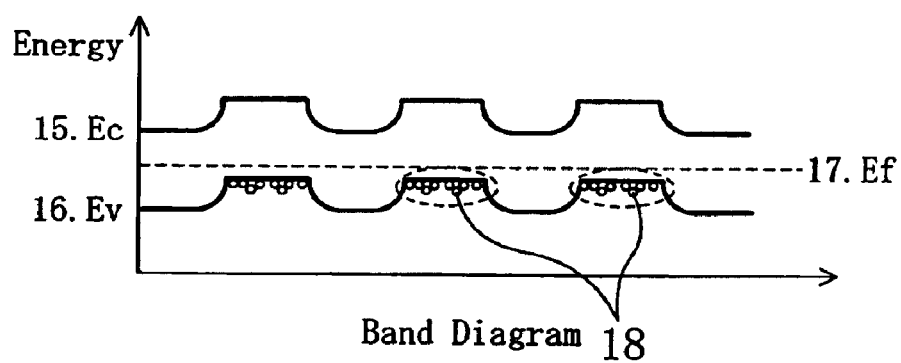

FIG. 6A is a view showing a cross section of an upper portion of a wafer for charge amount evaluation according to the present embodiment. FIGS. 6B and 6C are energy band diagrams of the cross section shown in FIG. 6A.

As shown in the drawing, the p-type regions 6 disposed as discrete islands are surrounded by the undoped silicon film 4 in a direction parallel with the substrate surface, while it is vertically surrounded by the overlying first oxide silicon film 2 and the underlying SA-NSG film 7.

As shown in FIG. 6B, the energy level of silicon containing a p-type impurity when equal Fermi energy 17 is provided is high in each of the conduction band edge energy (conduction band edge potential) 15 and valence band edge energy (valence band edge potential) 16. Accordingly, the valence band edge energy 16 of each the p-type regions 6 is higher than the valence band edge energy 16 of the surrounding undoped silicon film 4 so that the holes produced in the p-type region 6 and the undoped silicon film 4 by the specified process are accumulated in the p-type region 6.

The holes accumulated in the p-type region 6 are confined in the p-type region 6 by a potential barrier. In addition, tunneling from the p-type region 6 to the undoped silicon film 4 does not occur, either, due to a depletion layer in the undoped silicon film 4 having a thickness of 1 µm or more.

Moreover, since the layers each composed of $SiO_2$ larger in band gap and lower in valence band edge energy than silicon and sufficiently thick to prevent the tunneling of charge are provided over and under the p-type regions 6, the holes accumulated in the p-type region 6 do not leak in upward and downward directions. The holes 18 shown in FIG. 6C are not holes initially present in the p-type regions 6 but holes resulting from charging.

Thus, the evaluation method according to the present embodiment allows retention of the positive charge resulting from the specified process till a measurement time.

First Specific Example of Present Embodiment

As a first specific example of charge amount evaluation, a method for evaluating an amount of charge on a semiconductor device when a back-surface scrubbing cleaning process using pure water is performed will be described below.

Figure 7:
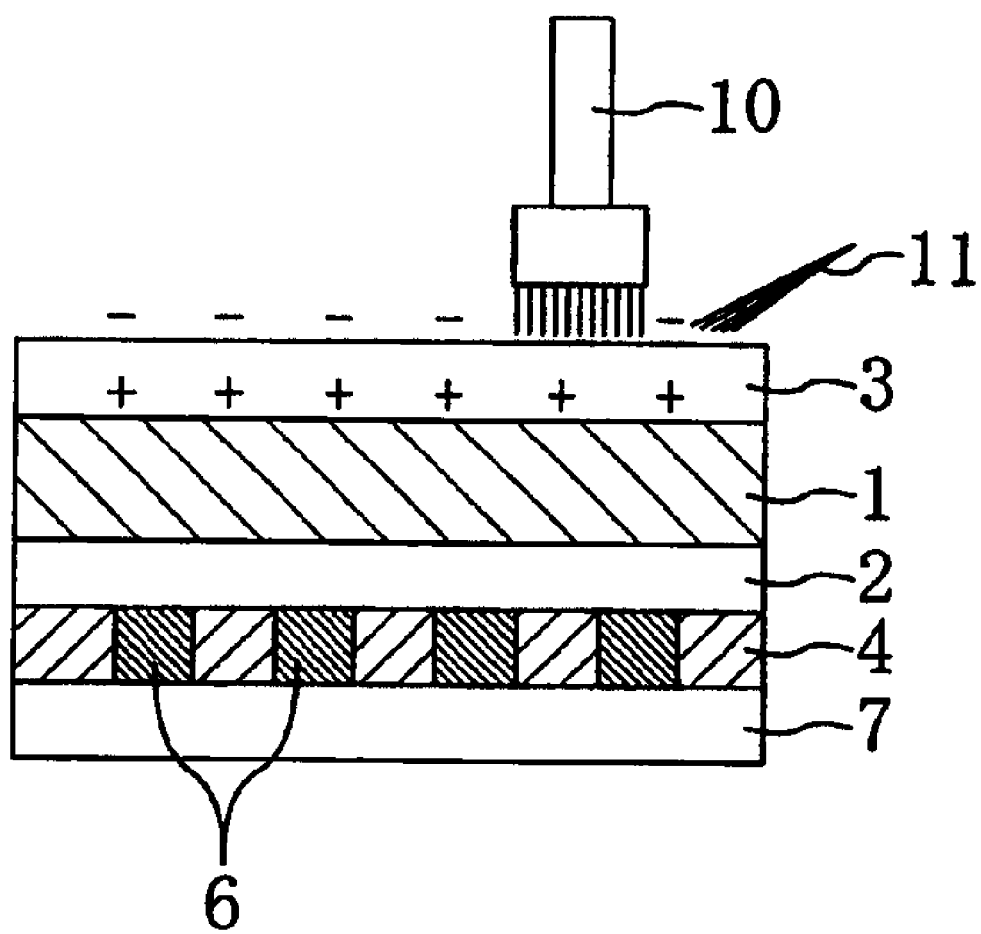
FIG. 7 is a schematic diagram for illustrating a method for evaluating an amount of charge on a semiconductor device according to a first specific example of the present invention.

FIG. 7 is a cross-sectional view for illustrating the method.

As shown in the drawing, a wafer for charge amount evaluation according to the present embodiment was prepared and back-surface scrubbing cleaning using pure water was performed.

Specifically, cleaning is performed by using a brush 10 to remove adhesions to the back surface of the wafer for charge amount evaluation and the like. In this case, conductive $CO_2$-added water (obtained by adding $CO_2$ to pure water 11) was used to allow charge normally induced between the brush and the wafer to escape.

By the back-surface scrubbing cleaning process, negative charge was induced on the back surface of the wafer for charge amount evaluation, while positive charge was induced in the portion of the second silicon oxide film 3 located adjacent the interface with the silicon substrate 1. In response to that, positive charge was induced also in the upper portion of each of the p-type regions 6.

Then, wet etching using a BHF solution was performed with respect to the wafer for charge amount evaluation, thereby removing the first silicon oxide film 2 and the second silicon oxide film 3 and also etching the p-type regions 6.

Figure 8:
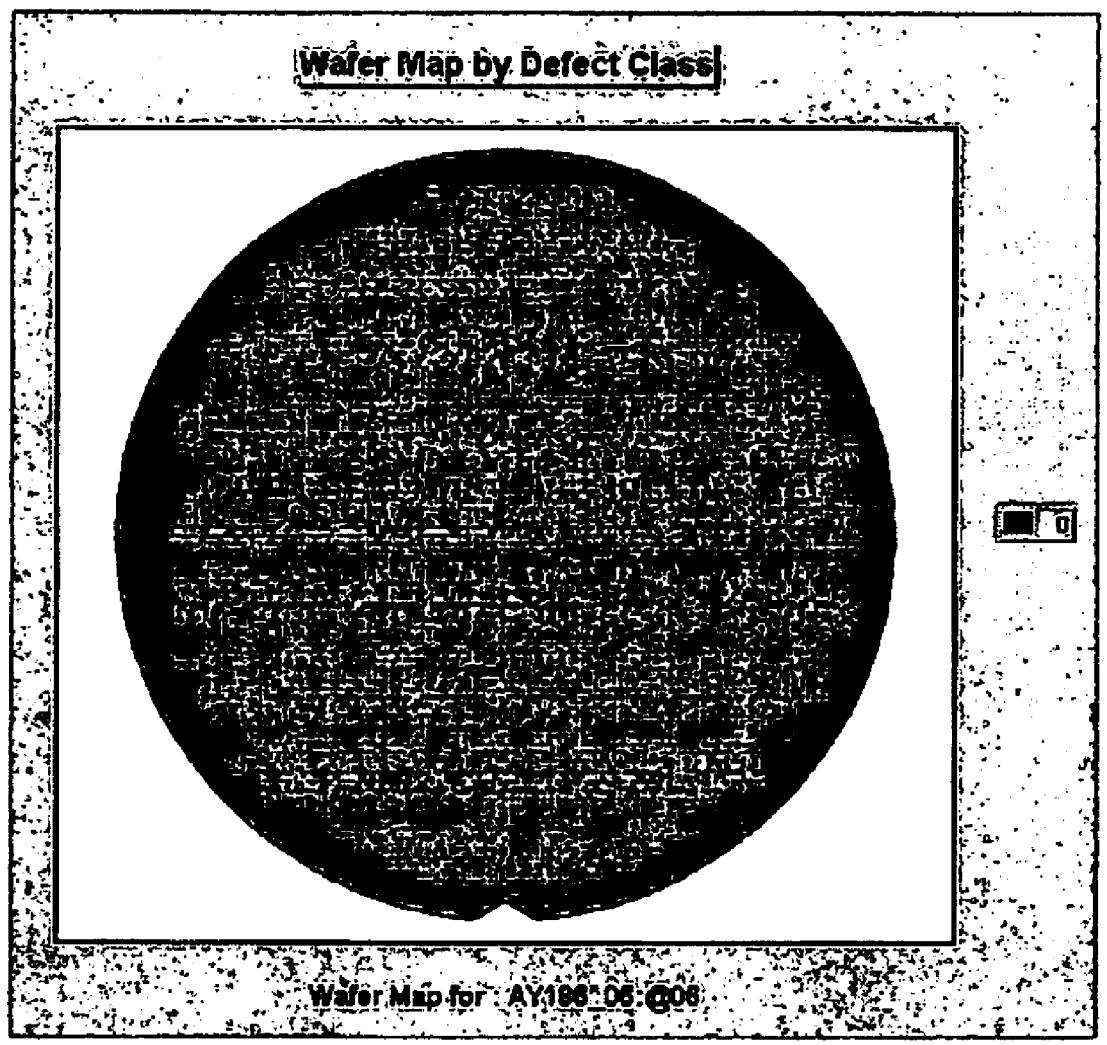
FIG. 8 is a microscopic photograph of an upper surface of a wafer for charge amount evaluation after a BHF process in the first specific example.

FIG. 8 is a microscopic photograph of the upper surface of the wafer for charge amount evaluation according to the present specific example after the BHF process. The black portions in the drawing correspond to the defective portions of the p-type region 6 caused by etching, which are seen over the entire surface of the wafer. An amount of etched silicon was calculated through such microscopic observation, through measurement using a defect evaluating apparatus, or from changes in the weight of the wafer, whereby an amount of charge induced on the wafer for charge amount evaluation was calculated. In the present specific example, the amount of charge induced on the wafer for charge amount evaluation was estimated to be about $6.1 \times 10^{-8}$ ($C/cm^2$).

Since the present specific example allows checking of whether or not discharging has been performed with the $CO_2$-added water used to clean the back surface of the substrate, proper cleaning conditions can be set based on the result of measurement.

Second Specific Example of Present Embodiment

First, a wafer for charge amount evaluation according to the present embodiment was prepared. At this time, the thickness of the SA-NSG film 7 is adjusted preferably to the range of about 1 nm to 100 nm. This is because, if the SA-NSG film 7 is excessively thick, charge is trapped in the SA-NSG film 7 so that a precise amount of charge is not determined and, if the SA-NSG film 7 is excessively thin, charge produced in the p-type regions 6 may leak toward the upper surface.

Then, boron ions are implanted from above the wafer for charge amount evaluation at an energy of, e.g., 20 eV and a dose of $1 \times 10^{15}$ $cm^{-2}$.

Then, the substrate for charge amount evaluation was treated with a BHF solution so that the first and second silicon oxide films 2 and 3 were removed and the p-type regions 6 were etched. Subsequently, an amount of etching in each of the p-type regions 6 was measured so that a charge up amount resulting from the implantation in the present specific example was estimated to be about $1.5 \times 10^{-7}$ ($C/cm^2$). Thus, the use of the wafer for charge amount evaluation also allows evaluation of the charge up amount resulting from ion implantation.

Third Specific Example of Present Embodiment

As a third specific example of the present embodiment, a method for evaluating plasma damage caused by gate dry etching will described.

FIGS. 9A to 9C and FIGS. 10A to 10C are cross-sectional views for illustrating a method for evaluating a damage caused by gate dry etching according to the third specific example of the present embodiment. In the present specific example, a wafer for charge amount evaluation having a gate insulating film and a polysilicon film each having the same thickness as a target semiconductor device for which an amount of charge is to be evaluated was fabricated.

Figure 9A:
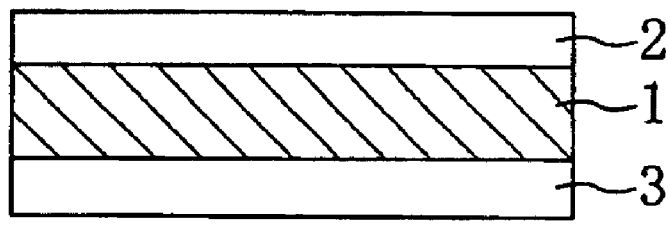
FIGS. 9A to 9C are cross-sectional views for illustrating a method for evaluating a damage caused by a gate dry etching according to a third specific example of the present invention.

First, in the step shown in FIG. 9A, the first and second silicon oxide films 2 and 3 were formed by a thermal treatment on the top and back surfaces of the silicon substrate 1, respectively, in the same manner as in the step shown in FIG. 1A.

Figure 9B:
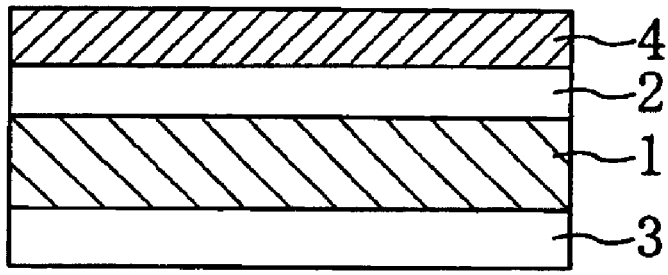

Then, in the step shown in FIG. 9B, the undoped silicon film 4 was formed on the first silicon oxide film 2 in the step shown in FIG. 9B.

Figure 9C:
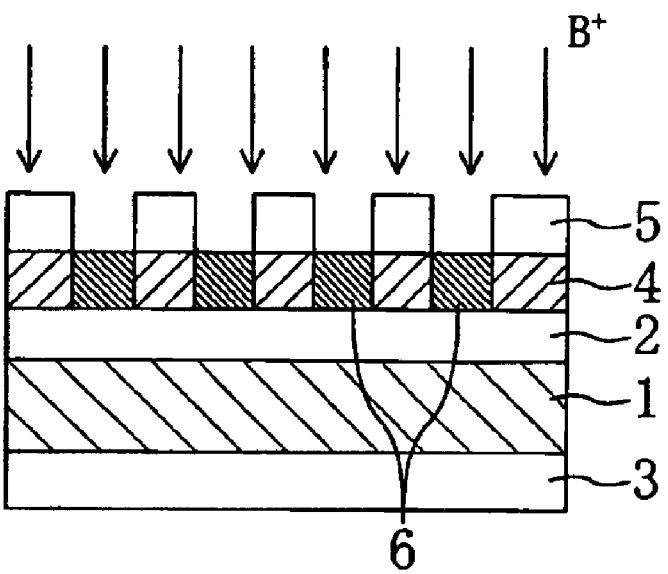

Then, in the step shown in FIG. 9C, the island p-type regions 6 were formed in the undoped silicon film 4 by resist patterning and the subsequent implantation of B (boron) ions. Heretofore, the fabrication process has been the same as that for the wafer for charge amount evaluation shown in FIG. 1.

Figure 10A:
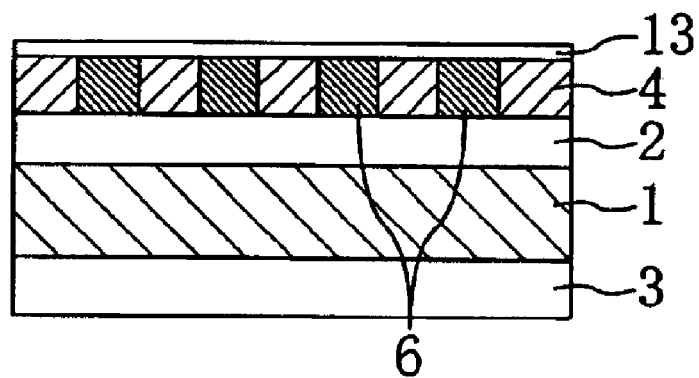
FIGS. 10A to 10C are cross-sectional views for illustrating the method for evaluating damage caused by gate dry etching according to the third specific example.

Next, in the step shown in FIG. 10A, a gate oxide film composed of $SiO_2$ was formed over the undoped silicon film 4 and the p-type regions 6 through thermal oxidation of the substrate or the like. The thickness of the gate oxide film was adjusted to be equal to that of the gate oxide film of a target semiconductor device for which an amount of charge is to be evaluated.

Figure 10B:
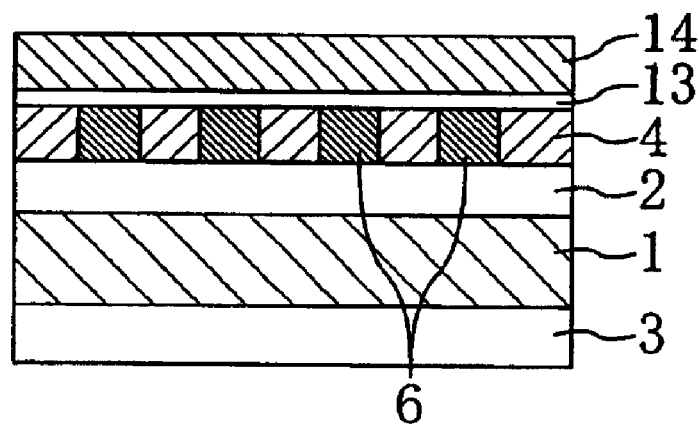

Next, in the step shown in FIG. 10B, the polysilicon film 14 was deposited. The thickness of a polysilicon film 14 was also adjusted to be equal to the thickness of the gate electrode of the target semiconductor device for which an amount of charge is to be evaluated. In this manner, the wafer for charge amount evaluation for evaluating damage caused in the gate electrode by dry etching was produced.

Figure 10C:
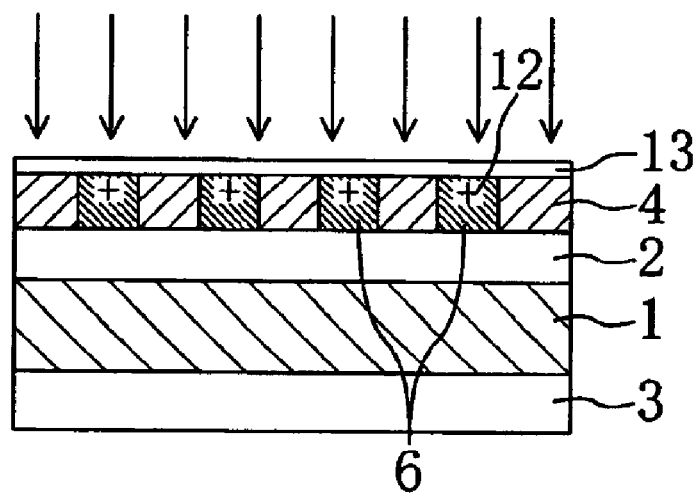

Subsequently, in the step shown in FIG. 10C, the entire surface of the polysilicon film 14 was etched back by dry etching. During the etch-back process, the charge jumped onto the wafer for charge amount evaluation is trapped and retained in the p-type regions 6.

Next, the wafer for charge amount evaluation according to the present specific example was treated with a BHF solution and an amount of etched silicon was measured. This enabled estimation of plasma charge received by the wafer during the dry etching of the gate electrode.

In accordance with the present method, etching-induced damage can be judged larger as the amount of plasma charge received during the dry etching is larger. Therefore, the use of the wafer for charge amount evaluation according to the present specific example allows measurement of damage caused in a gate oxide film or the like by dry etching during the formation of a gate electrode.

Although the present specific example has shown the evaluation method in the gate dry etching step, the thickness and material of the gate oxide film on the p-type regions 6 may also be changed. Likewise, an amount of plasma charge in an arbitrary dry etching step can be estimated by properly changing the material of the polysilicon film 14. If the polysilicon film 14 is replaced with another conductor film, e.g., an Al film, an amount of plasma charge during the dry etching of Al can be estimated.

Thus, the use of the wafer for charge amount evaluation according to the present invention allows accurate measurement of an amount of charge produced in a semiconductor device by various processes including back-surface scrubbing cleaning, ion implantation, and dry etching. Since the measurement of an amount of charge according to the present embodiment allows retention of the charge produced by the process till the time of measurement and direct measurement of an amount of positive charge, quantitative measurement can be performed. Since it is no more necessary to fabricate a target device for which an amount of charge is to be evaluated, the process of evaluating an amount of charge can be performed more easily and conveniently.

The method for evaluating an amount of charge according to the present invention performs a specified fabrication process with respect to a wafer for charge amount evaluation having p-type regions surrounded by an undoped silicon film and an insulating film and then etches the wafer in a BHF solution. This allows direct measurement of charge produced by the process and quantitative evaluation of the amount of charge. As a result, an amount of charge can be evaluated more easily and conveniently than by a conventional evaluation method.

What is claimed is:

1. A method for evaluating an amount of charge, the method comprising the steps of:
   (a) preparing an apparatus for evaluating an amount of charge, the apparatus comprising a semiconductor substrate having a first insulating film on an upper portion thereof, a substantially intrinsic undoped silicon layer provided on the first insulating film, p-type regions each surrounded by the undoped silicon layer and composed of silicon containing a p-type impurity, and a second insulating film provided over the undoped silicon layer and the p-type regions;
   (b) performing a specified process with respect to the apparatus for evaluating an amount of charge;
   (c) after the step (b) immersing the apparatus for evaluating an amount of charge in an etching solution and etching at least the p-type regions in accordance with a principle of anodization; and
   (d) calculating, from an amount of etching in each of the p-type regions, an amount of charge caused b the specified process in the apparatus for evaluating an amount of charge.

2. The method of claim 1, wherein the etching solution used in the step (c) contains ions including those of F atoms.

3. The method of claim 1, wherein the step (d) includes calculating the amount of etching in each of the p-type regions from a change in a weight of the p-type region.

4. The method of claim 1, wherein
   the apparatus for evaluating an amount of charge further comprises a back-surface insulating film provided on a back surface of the semiconductor substrate and
   the specified process in the step (b) is a back-surface scrubbing process for cleaning the back-surface insulating film.

5. The method of claim 1, wherein the specified process in the step (b) is ion implantation.

6. The method of claim 1, wherein
   the apparatus for evaluating an amount of charge further comprises a conductor film provided on the second insulating film and
   the specified process the step (b) is dry etching of the conductor film.

* * * * *